United States Patent
Kanamori et al.

(10) Patent No.: US 7,296,097 B2
(45) Date of Patent: Nov. 13, 2007

(54) MEMORY CARD AND INITIALIZATION SETTING METHOD THEREOF TO AVOID INITIALIZING OPERATION FAILURE IN A MEMORY CARD

(75) Inventors: Motoki Kanamori, Yokkaichi (JP); Shigeo Kurakata, Tokorozawa (JP); Chiaki Kumahara, Kodaira (JP); Hidefumi Odate, Kodaira (JP); Atsushi Shikata, Higashiyamato (JP)

(73) Assignee: Renesas Technology Corp., Tokyo (JP)

( * ) Notice: Subject to any disclaimer, the term of this patent is extended or adjusted under 35 U.S.C. 154(b) by 157 days.

(21) Appl. No.: 10/549,614

(22) PCT Filed: Mar. 20, 2003

(86) PCT No.: PCT/JP03/03414

§ 371 (c)(1),
(2), (4) Date: Sep. 20, 2005

(87) PCT Pub. No.: WO2004/084127

PCT Pub. Date: Sep. 30, 2004

(65) Prior Publication Data

US 2006/0248388 A1  Nov. 2, 2006

(51) Int. Cl.
*G06F 3/00* (2006.01)
*G06F 5/00* (2006.01)
*G06F 11/00* (2006.01)
*G06F 9/44* (2006.01)

(52) U.S. Cl. .............. 710/10; 710/8; 710/49; 714/25; 717/168; 717/171

(58) Field of Classification Search ............ 710/8
See application file for complete search history.

(56) References Cited

U.S. PATENT DOCUMENTS

| 6,708,231 B1 * | 3/2004 | Kitagawa ............ 710/10 |
| 2001/0000405 A1 * | 4/2001 | Gray et al. ........... 235/375 |
| 2004/0064686 A1 * | 4/2004 | Miller et al. ........... 713/1 |

FOREIGN PATENT DOCUMENTS

| JP | 6-187133 | 7/1994 |
| JP | 2003-30613 | 1/2003 |

* cited by examiner

*Primary Examiner*—Donald Sparks
*Assistant Examiner*—Brooke J Dews
(74) *Attorney, Agent, or Firm*—Miles & Stockbridge P.C.

(57) ABSTRACT

Whether an initial command outputted from a host is 'CMD1' or 'CMD55+CMD41' is detected with an initial command detection portion 8, and the result of detection is set in an SD/MMC register 13. Reset process for hardware and that for firmware are carried out based on the result of detection set in the SD/MMC register 13. Thereafter, a microcomputer 7 sets data indicating in which mode, MultiMedia Card mode or SD mode, the firmware reset process was carried out, in a F/W process SD/MMC register 14. A H/W-F/W mode comparison circuit 15 compares data in the SD/MMC register 13 with data in the F/W process SD/MMC register 14. If these data agree with each other, busy state is released, and command wait state is established. If they disagree with each other, a disagreement occurrence detection signal is outputted to the microcomputer 7, and power-on reset processing is performed again.

15 Claims, 14 Drawing Sheets

FIG. 2

| PIN NO. | DESIGNATION | I/O | DESCRIPTION |
|---|---|---|---|
| 1 | RESERVED | NC | RESERVED TERMINAL |
| 2 | CMD | I/O | COMMAND |
| 3 | VSS1 | — | GROUND |
| 4 | VCC | — | POWER SUPPLY |
| 5 | CLK | I | CLOCK |
| 6 | VSS2 | — | GROUND |
| 7 | DAT0 | I/O | DATA BUS bit [0] |

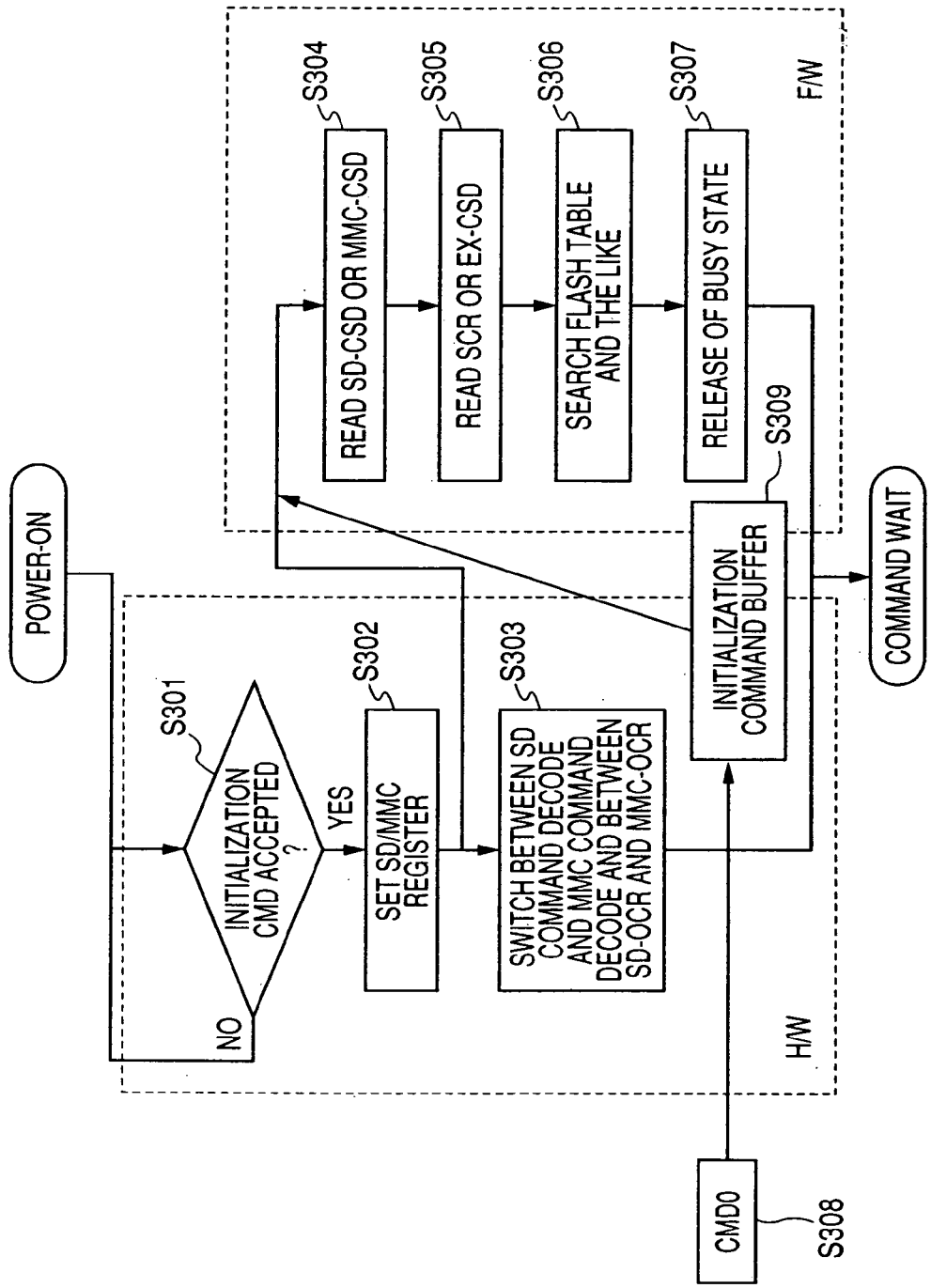

FIG. 11 (PRIOR ART)

| DIFFERENCE | SD | MMC | INFLUENCE |
|---|---|---|---|
| INITIALIZATION COMMAND | CMD55+CMD41 | CMD1 | |
| CSD VALUE (bit [46:37]) | GROUP ERASE PARAMETER DEFINITION | ERASE SECTOR/GROUP PARAMETER DEFINITION | HOST ERASE DEFINITION DIFFERS |
| COMMAND SUPPORT | ACMDxx FOR SD (CMD55+CMDxx) | SCMDyy FOR S-MMC (CMD55+CMDyy) | COMMAND DIFFERS |
| OCR VALUE (bit [7:0]) | DEFINE VCC = 1.6 TO 2.0V AT bit [7:4] | DEFINE VCC = 1.65 TO 1.95V AT bit [7] | SUPPORT VOLTAGE DEFINITION DIFFERS |
| OTHER REGISTER | SCR REGISTER (512B) PROVIDED | EX-CSD REGISTER (512B) PROVIDED | SUPPORT FUNCTION AND STATUS CHECK METHOD DIFFER |

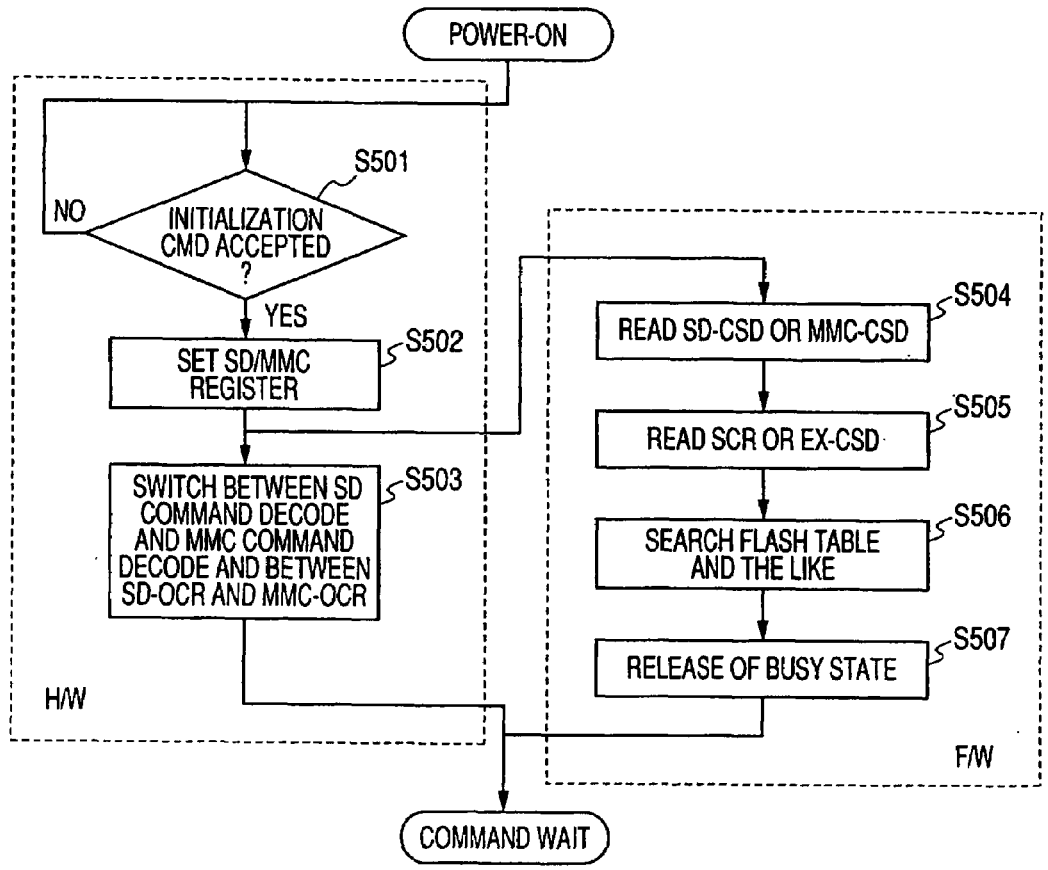

US 7,296,097 B2

MEMORY CARD AND INITIALIZATION SETTING METHOD THEREOF TO AVOID INITIALIZING OPERATION FAILURE IN A MEMORY CARD

TECHNICAL FIELD

The present invention relates to a technology effectively applicable to techniques to avoid initializing operation failure in a memory card.

BACKGROUND ART

Various external storage media for personal computers and multifunctional terminals are widely known. Such external storage media include MultiMedia Card (registered trademark) standardized by the MMCA (MultiMedia Card Association) and SD (Secure Digital) Card (registered trademark) standardized by the SDA (SD card Association). The MMCA and the SDA are standard-setting organizations. These external storage media are used for recording still-frame video images in digital video cameras, recording data in cellular phones, recording music in portable music players, and the like.

The present inventors found that the above memory cards have the following problems:

To further enhance the convenience of these external storage media, a memory card that operates in accordance with both the MultiMedia Card standard and the SD Card standard is desired.

FIG. 11 is an explanatory drawing illustrates differences between the MultiMedia Card standard and the SD Card standard. As shown in the figure, these cards are different in specifications for setting initialization command, CSD value, command support, OCR (Operation Condition Register) value, and other registers.

The present inventors examined a memory card that operates in both modes, MultiMedia Card mode in which it operates in accordance with the MultiMedia Card standard and SD mode in which it operates in accordance with the SD Card standard. FIG. 12 is an internal block diagram of the memory card.

In this case, as illustrated in the figure, the memory card 50 is comprised of a flash memory 51 and a controller 52. The controller 52 comprises an internal interface logic 53, a host interface 54, data buffers 55, and a microcomputer 56.

Data for SD-CSD (Card Specific Data), SCR (Secure Register), MMC-CSD, EX(EXtend)-CSD, and the like are stored in the system area of the flash memory 51.

The internal interface logic 53 comprises interfaces for the flash memory 51, data buffers 55, and microcomputer 56.

The host interface 54 accepts commands instructing the operation of writing/reading/erasing, outputted and inputted from a host. The interface logic inputs and outputs data required for these operations.

The data buffers 55 temporarily store data inputted and outputted from a host and the flash memory 51. In addition, they store either SD-CSD and SCR or MMC-CSD and EX(EXtend)-CSD read from the flash memory 51 by the controller 52. The microcomputer 56 is responsible for control of all the aspects of the controller 52.

The host interface 54 comprises an initial command detection portion 57, an MMC command decode 58, an SD command decode 59, an MMC-OCR 60, an SD-OCR 61, an SD/MMC register 62, and switch portions 63 and 64.

The initial command detection portion 57 detects which an inputted initial command is, a command under the SD standard or a command under the MMC standard. The SD/MMC register 62 stores detection signals detected by the initial command detection portion 57.

The microcomputer 56 refers to the result of detection stored in the SD/MMC register 62 to determine whether to operate in MultiMedia Card mode or SD mode.

The switch portions 63 and 64 change the destination of signal output based on the result of detection stored in the SD/MMC register 62. The MMC command decode 58 decodes commands under the MMC standard when the memory card 50 operates in MultiMedia Card mode. The SD command decode 59 decodes commands under the SD standard when the memory card 50 operates in SD mode.

The MMC-OCR 60 defines a voltage range within which operation in MultiMedia Card mode is possible, and the SD-OCR 61 defines a voltage range within which operation in SD mode is possible.

The switch portion 63 operates as follows depending on the result of detection stored in the SD/MMC register 62: if the result of detection is MultiMedia Card mode, the switch portion changes connection so that an inputted command is inputted to the MMC command decode 58; if the result of detection is SD mode, the switch portion changes connection so that an inputted command is inputted to the SD command decode 59.

The switch portion 64 operates as follows depending on the result of detection stored in the SD/MMC registers 62: if the result of detection is MultiMedia Card mode, the switch portion changes connection so that data in the MMC-OCR 60 is outputted; if the result of detection is SD mode, the switch portion changes connection so that data in the SD-OCR 61 is outputted.

Description will be given to the operation of power-on reset processing in the memory card 50 examined by the present inventors with reference to the timing chart in FIG. 13 and the flowchart in FIG. 14. Here, it will be assumed that 'CMD55+CMD41' for SD mode is inputted as an initial command to the memory card 50.

FIG. 13 illustrates the signal timing with respect to commands outputted from a host, the SD/MMC register 62, the firmware process of the microcomputer 56, the initial command detection portion 57, the MMC-OCR 60/the SD-OCR 61, and the MMC command decode 58/the SD command decode 59 from top down.

In FIG. 14, the flowchart encircled with a broken line, shown on the left, illustrates the initialization process for hardware, and the flowchart encircled with a broken line, shown on the right, illustrates the initialization process for firmware.

When a supply voltage VCC is supplied to the memory card 50, initialization command 'CMD55+CMD41' is outputted from the host. The initialization command is for checking the voltage range within which the memory card 50 can operate and checking whether the internal processing of the memory card 50 has been completed (Step S501).

The initial command detection portion 57 detects the initialization command, and outputs the result of detection to the SD/MMC register 62 to set it in the register (Step S502).

The switch portions 63 and 64 operate as follows: the switch portion 63 changes connection so that a command outputted from the host is inputted to the SD command decode 59, based on data set in the SD/MMC register 62; the switch portion 64 changes connection so that data in the SD-OCR 61 is outputted (Step S503). Thereafter, the memory card 50 enters command wait state.

In parallel with the process of Step S503, the microcomputer 56 accesses the flash memory 51 based on the result of detection set in the SD/MMC register 62. It reads SD-CSD stored in the system area (Step S504), and stores it in the data buffers 55. Subsequently, the microcomputer 56 reads SCR from the flash memory 51 (Step S505), and stores it in the data buffers 55.

Thereafter, the microcomputer 56 searches a flash table for managing an alternate area and the like (Step S506), releases busy state (Step S507), and enters command wait state.

If 'CMD1,' or the initialization command for MultiMedia Card mode, is inputted from the host, for example, after the initialization process for hardware, illustrated in the left part of FIG. 14 encircled with a broken line, during this power-on reset processing, a problem arises. When the hardware releases busy state, it starts initializing operation in Multi-Media Card mode again. However, the initialization process for firmware, illustrated in the right part of FIG. 14 encircled with a broken line, is not carried out, and the mode recognition of hardware becomes inconsistent with that of firmware.

An object of the present invention is to provide a memory card and an initialization setting method thereof wherein, even if an initialization command for a different operation mode is inputted during initialization in some operation mode, initializing operation failure can be prevented without fail.

The above and other objects and novel features of the present invention will be apparent from the description in this specification and the accompanying drawings.

DISCLOSURE OF THE INVENTION

The following is a brief description of the gist of the representative elements of the invention laid open in this application.

(1) The present invention is a memory card comprising: a nonvolatile semiconductor memory having a plurality of nonvolatile memory cells, and capable of storing predetermined information; and a controller that instructs the operation of the nonvolatile semiconductor memory according to a command issued from the outside.

The controller comprises a host interface portion. The host interface portion detects an initialization setting command for first or second operation mode issued from the outside. If, after completion of initialization setting according to the initialization setting command, the operation mode of the detected initialization setting command does not agree with the operation mode in which firmware reset process is carried out, the host interface portion outputs a disagreement detection signal. If, after execution of initialization setting, the controller receives a disagreement occurrence detection signal from a comparison circuit, it carries out initialization process again based on the result of detection stored in an initialization command storage portion.

The following is a brief description of the gist of other elements of the invention laid open in this application.

(2) The present invention is a memory card comprising: a nonvolatile semiconductor memory having a plurality of nonvolatile memory cells, and capable of storing predetermined information; and a controller that instructs the operation of the nonvolatile semiconductor memory according to a command issued from the outside. The controller comprises a host interface portion. When an initialization setting command for first or second operation mode, issued from the outside, is detected, the host interface portion outputs a mask signal. While initialization setting in either first or second operation mode is being carried out, it does not accept a new initialization setting command.

(3) The present invention is a memory card comprising: a nonvolatile semiconductor memory having a plurality of nonvolatile memory cells, and capable of storing predetermined information; and a controller that instructs the operation of the nonvolatile semiconductor memory according to a command issued from the outside. The controller comprises a host interface portion that detects an initialization setting command for first or second operation mode issued from the outside, and successively stores the result of detection. Each time the host interface portion receives an initialization setting completion signal, it successively outputs the stored results of detection. The controller carries out initialization setting for either first or second operation mode based on the result of detection. If any new result of detection is stored after completion of initialization setting, the controller carries out firmware reset process based on the result.

The following is a brief item-by-item description of the gist of other elements of the invention laid open in this application.

(1) The present invention is an initialization setting method for memory card, including the following steps:

(a) a step in which an initialization setting command for first or second operation mode, issued from the outside, is detected by an initial command detection portion;

(b) a step in which the result of detection by the initial command detection portion is stored in an initialization command storage portion;

(c) a step in which a controller carries out initialization setting for either a first or a second operation mode based on the result of detection stored in the initialization command storage portion;

(d) a step in which data indicating in which operation mode the firmware reset process was carried out during initialization setting for first or second operation mode is stored in a firmware reset process storage portion;

(e) a step in which the result of detection stored in the initialization command storage portion is compared with data stored in the firmware reset process storage portion through a comparison circuit, and, if they do not agree with each other, a disagreement occurrence detection signal is outputted; and (f) a step in which, on receipt of the disagreement occurrence detection signal, the controller carries out initialization process again based on the result of detection stored in the initialization command storage portion.

(2) The present invention is an initialization setting method for memory card, including the following steps:

(a) a step in which an initialization setting command for first or second operation mode, issued from the outside, is detected by an initial command detection portion;

(b) a step in which the result of detection by the initial command detection portion is stored in an initialization command storage portion;

(c) a step in which, when the initial command detection portion detects an initialization setting command for first or second operation mode, a mode setting mask portion outputs a mask signal to the initialization command storage portion to mask any result of detection newly inputted to the initialization command storage portion; and (d) a step in which a controller carries out initialization setting for either first or second operation mode based on the result of detection stored in the initialization command storage portion.

(3) The present invention is an initialization setting method for memory card, including the following steps:

(a) a step in which an initialization setting command for first or second operation mode, issued from the outside, is detected by an initial command detection portion;

(b) a step in which the first result of detection by the initial command detection portion is stored in an initialization command storage portion;

(c) a step in which the results of detection by the initial command detection portion are successively stored in the initialization command storage portion;

(d) a step in which initialization setting for either first or second operation mode is carried out based on the result of detection stored in the initialization command storage portion, and, after completion of initialization setting, an initialization setting completion signal is outputted from a reset completion setting portion; and (e) a step in which, after completion of initialization setting, firmware reset process is carried out based on the results successively outputted from the initialization command storage portion each time an initialization setting completion signal is received.

BRIEF DESCRIPTION OF THE DRAWINGS

FIG. 2 is an explanatory drawing of the connector pins of the memory card in FIG. 1;

FIG. 10 is a flowchart illustrating power-on reset processing in the memory card in FIG. 8;

FIG. 11 is an explanatory drawing illustrating differences in commands between the SD Card standard and the MultiMedia Card standard;

FIG. 14 is a flowchart illustrating power-on reset processing in the memory card in FIG. 12.

BEST MODE FOR CARRYING OUT THE INVENTION

Figure 1:
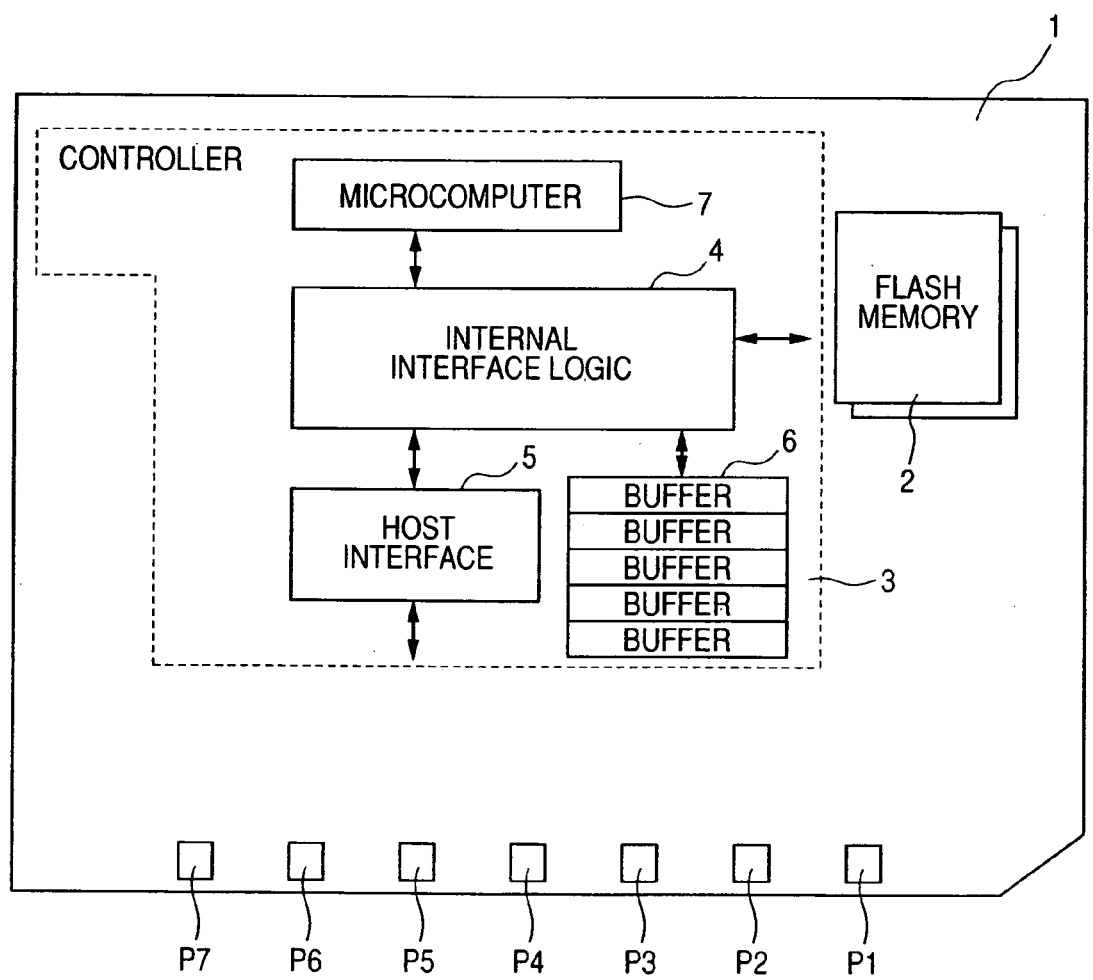
FIG. 1 is a block diagram of a memory card in a first embodiment of the present invention.

Detailed description will be given to the present invention with reference to the accompanying drawings. In all the following drawings for the description of embodiments of the present invention, members having the same function will be marked with the same reference numerals, and the repetitive description thereof will be omitted.

FIRST EMBODIMENT

A memory card 1 in the first embodiment is used as external storage media for a host, such as digital video camera, cellular phone, portable music player, and personal computer. It is a memory card that operates in accordance both with the SD Card standard and with the MultiMedia Card standard.

As illustrated in FIG. 1, the memory card 1 comprises a flash memory (nonvolatile semiconductor memory) 2 and a controller 3. The controller 3 comprises an internal interface logic 4, a host interface (host interface portion) 5, data buffers 6, and a microcomputer 7.

The flash memory 2 is a nonvolatile semiconductor memory in which data can be electrically rewritten and erased. Data for SD-CSD, SCR, MMC-CSD, EX-CSD, and the like are stored in the system area of the flash memory 2.

The SD-CSD is a card characteristic register for SD Card, which stores varied information related to the memory card 1 in SD mode (first operation mode) that operates in accordance with the SD Card standard. The SCR is a register that stores the security information of secure mode of the memory card 1 in SD mode and the status of the card.

The MMC-CSD is a card characteristic register for MultiMedia Card, which stores varied information related to the memory card 1 in MultiMedia Card mode (second operation mode) that operates in accordance with the MultiMedia Card standard.

The EX-CSD is a register that stores the security information of secure mode of the memory card 1 in MultiMedia Card mode.

The internal interface logic 4 is an interface for the flash memory 2, data buffers 6, and microcomputer 7. The host interface 5 receives a command instructing the operation of reading/writing/erasing inputted and outputted from the host, and inputs and outputs data required for these operations.

The data buffers 6 temporarily store data inputted and outputted from the host and the flash memory 2. Further, they store either SD-CSD and SCR or MMC-CSD and EX-CSD read from the flash memory 2 by the controller 3. The microcomputer 7 is responsible for control of all the aspects of the controller 3.

As illustrated in the figure, connector pins P1 to P7 for connection with the host are provided at the lower part of the memory card 1 in a direction from right to left. The connector pin P1 closest to the cut formed at a lower corner of the memory card 1 is pin #1, and the connector pin P7 farthest from the cut is pin #7.

FIG. 2 illustrates the pin configuration of these connector pins P1 to P7. The connector pin P1 is of NC (No Connect), and the connector pins P3 and P6 are connected with ground as reference potential.

Commands are inputted and outputted to the connector pin P2, and external clock signals are inputted to the connector pin P5. Data is inputted and outputted to the connector pin P7.

In the description of this embodiment, the memory card 1 adopts the connector pin configuration for MultiMedia Card. Instead, the memory card 1 may adopt the connector pin configuration for SD Card.

In this case, the number of connector pins is nine, and an additional connector pin is respectively disposed on the left and right of the connector pins P1 and P7. The additional connector pins are I/O pins to which data is inputted and outputted, like the connector pin P7.

Figure 3:
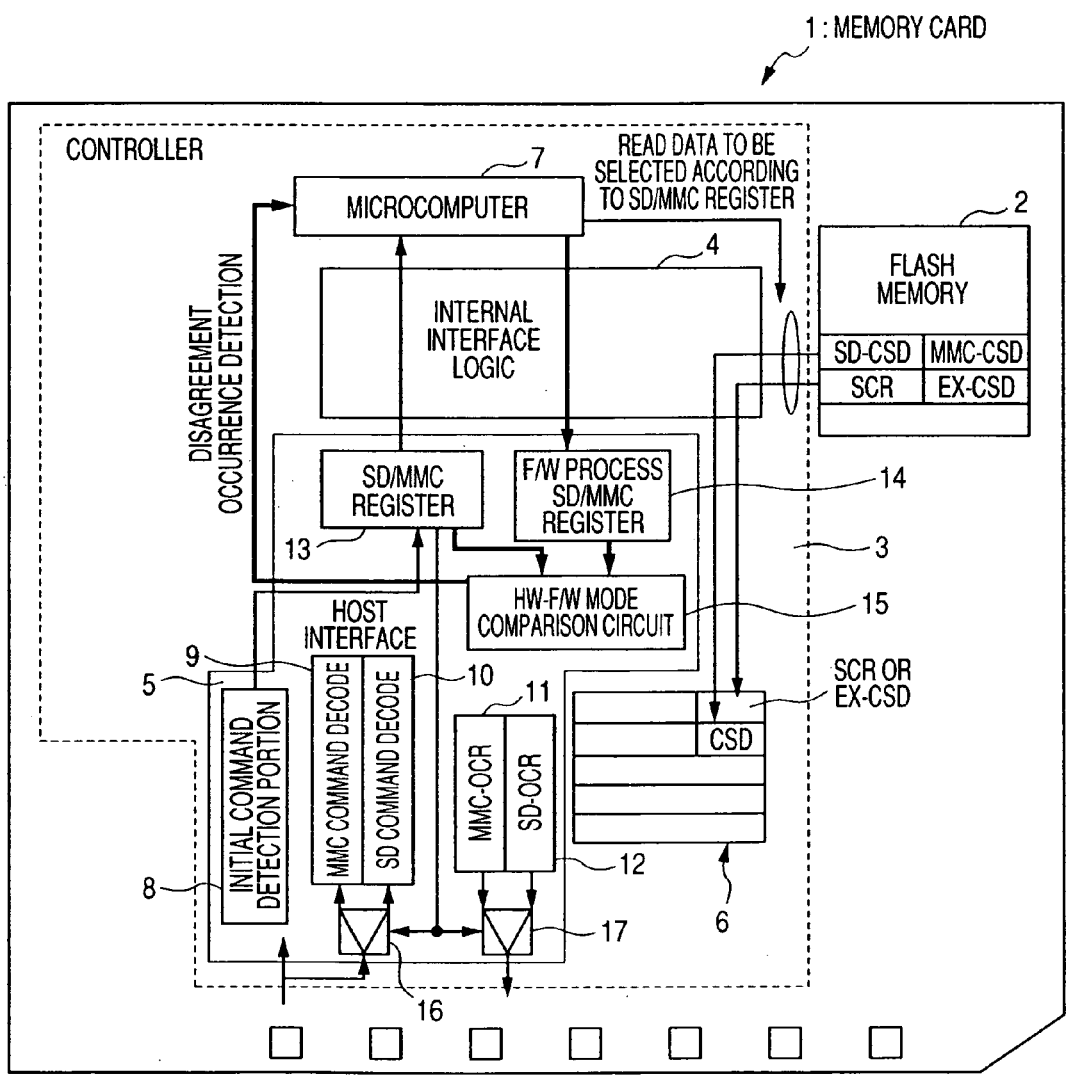
FIG. 3 is a block diagram of the host interface provided in the memory card in FIG. 1.

Description will be given to the internal configuration of the host interface 5 with reference to FIG. 3.

The host interface 5 comprises: an initial command detection portion 8, an MMC command decode (second command decode portion) 9, an SD command decode (first command decode portion) 10, an MMC-OCR (second OCR) 11, an SD-OCR (first OCR) 12, an SD/MMC register (initialization command storage portion) 13, a F/W process SD/MMC register (firmware reset process storage portion) 14, a H/W-F/W mode comparison circuit (comparison portion) 15, and switch portions 16 and 17.

The initial command detection portion 8 detects whether an initial command inputted through the connector pin P2 is a command under the SD standard or a command under the MMC standard. The initial command detection portion 8 is connected with the SD/MMC register 13.

The SD/MMC register 13 stores detection signals detected by the initial command detection portion 8. The SD/MMC register 13 is connected with the microcomputer 7 and the switch portions 16 and 17.

The microcomputer 7 refers to the result of detection stored in the SD/MMC register 13, and thereby determines whether to operate in MultiMedia Card mode or SD mode.

The switch portions 16 and 17 change the destination of signal output based on the result of detection stored in the SD/MMC register 13. The input of the switch portion (first switching portion) 16 is connected with the connector pin P2.

One output of this switch portion 16 is connected with the MMC command decode 9, and the other output is connected with the SD command decode 10.

The MMC command decode 9 decodes commands under the MMC standard when the memory card 1 operates in MultiMedia Card mode. The SD command decode 10 decodes commands under the SD standard when the memory card 1 operates in SD mode.

One input of the switch portion (second switching portion) 17 is connected with the MMC-OCR 11, and the other input is connected with the SD-OCR 12. The output of this switch portion 17 is connected with the connector pin P7. The MMC-OCR 11 defines a voltage range within which operation in MultiMedia Card mode is possible, and the SD-OCR 12 defines a voltage range within which operation in SD mode is possible.

Therefore, the switch portion 16 operates as follows: if the result of detection stored in the SD/MMC register 13 is MultiMedia Card mode, it changes connection so that commands inputted through the connector pin P2 are inputted to the MMC command decode 9; if the result of detection is SD mode, it changes connection so that commands inputted through the connector pin P2 are inputted to the SD command decode 10.

The switch portion 17 operates as follows: if the result of detection stored in the SD/MMC register 13 is MultiMedia Card mode, it changes connection so that data in the MMC-OCR 11 is outputted through the connector pin P7; if the result of detection is SD mode, it changes connection so that data in the SD-OCR 12 is outputted through the connector pin P7.

The F/W process SD/MMC register 14 is connected with the microcomputer 7, and stores the results indicating in which mode, MultiMedia Card mode or SD mode, firmware reset process outputted from the microcomputer 7 was carried out.

The H/W-F/W mode comparison circuit 15 is so connected that data stored in the SD/MMC register 13 and the F/W process SD/MMC register 14 are inputted thereto. It compares these data with each other to determine whether they agree with each other or not.

If data from the SD/MMC register 13 and data from the F/W process SD/MMC register 14 do not agree with each other, the H/W-F/W mode comparison circuit 15 outputs a disagreement occurrence detection signal to the microcomputer 7.

Figure 4:
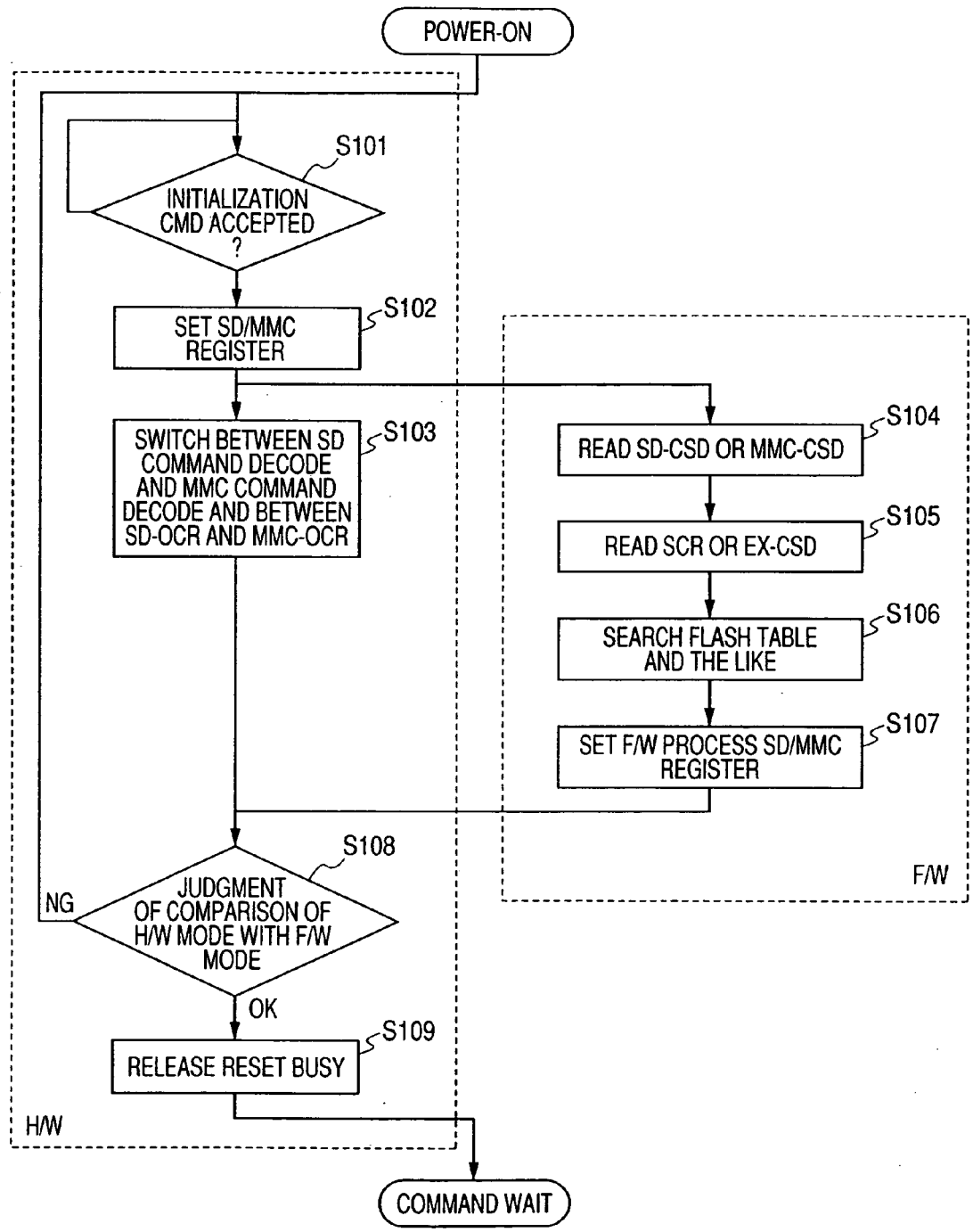
FIG. 4 is a flowchart of power-on reset processing in the memory card in FIG. 1.

Description will be given to power-on reset processing in a memory card 1 in the first embodiment with reference to the flowchart in FIG. 4. In FIG. 4, the flowchart encircled with a broken line, shown on the left, illustrates initialization process for hardware, and the flowchart encircled with a broken line, shown on the right, illustrates initialization process for firmware.

When the memory card 1 is inserted into a memory slot or the like provided in a host, a supply voltage VCC is supplied to the memory card 1 through a connector pin in the memory slot.

An initialization command is outputted from the host. The initialization command is for checking the voltage range within which the memory card 1 can operate and checking whether the internal processing of the memory card 1 has been completed (Step S101).

The initial command detection portion 8 detects whether the inputted initialization command is 'CMD1' for MultiMedia Cardmode or 'CMD55+CMD41' for SD mode. It outputs the result of detection to the SD/MMC register 13 to set it in the SD/MMC register 13 (Step S102).

The switch portions 16 and 17 change connection based on the data set in the SD/MMC register 13 (Step S103), and thereafter the memory card 1 enters command wait state.

If the data set in the SD/MMC register 13 is of MultiMedia Card mode, the switch portion 16 changes connection so that commands outputted from the host are inputted to the MMC command decode 9. The switch portion 17 changes connection so that data in the MMC-OCR 11 is outputted.

If the data set in the SD/MMC register 13 is of SD mode, the switch portion 16 changes connection so that commands outputted from the host are inputted to the SD command decode 10. The switch portion 17 changes connection so that data in the SD-OCR 12 is outputted.

In parallel with the process of Step S103, the microcomputer 7 accesses the flash memory 2 based on the result of detection set in the SD/MMC register 13. It reads either the SD-CSD or the MMC-CSD stored in the system area (Step S104), and stores it in the data buffers 6.

Subsequently, the microcomputer 7 reads either the SCR or the EX-CSD from the flash memory 2 (Step S105), and stores it in the data buffers 6.

If the data set in the SD/MMC register 13 is of MultiMedia Card mode, the microcomputer 7 reads the MMC-CSD and the EX-CSD during the processes of Steps S104 and S105. If the data set in the SD/MMC register 13 is of SD mode, the microcomputer 7 reads the SD-CSD and the SCR.

Thereafter, the microcomputer 7 searches a flash table for managing an alternate area and the like (Step S106). It sets data indicating in which mode, MultiMedia Card mode or SD mode, firmware reset process was carried out in the F/W process SD/MMC register 14 (Step S107).

The H/W-F/W mode comparison circuit 15 compares the data set in the SD/MMC register 13 with the data set in the F/W process SD/MMC register 14 (Step S108). If they are agree with each other, busy state is released, and the memory card enters command wait state.

If the process of Step S108 reveals that the data in the SD/MMC register 13 and the data in the F/W process SD/MMC register 14 disagree with each other, a disagreement occurrence detection signal is outputted to the microcomputer 8. Then, the processes of Steps S101 to S108 are carried out again (power-on reset processing).

This power-on reset processing is repeatedly carried out until the data in the SD/MMC register 13 and the data in the F/W process SD/MMC register 14 agree with each other.

Therefore, even if an initialization command for the other operation mode is inputted while the memory card 1 is performing initializing operation in either operation mode, power-on reset processing is repeatedly carried out until the initialization process for hardware and that for firmware agree with each other.

Thus, according to the first embodiment, initializing operation failure can be prevented without fail in a memory card 1 that operates both in SD mode and in MultiMedia Card mode. As a result, the reliability of the memory card 1 can be significantly enhanced.

SECOND EMBODIMENT

Figure 5:
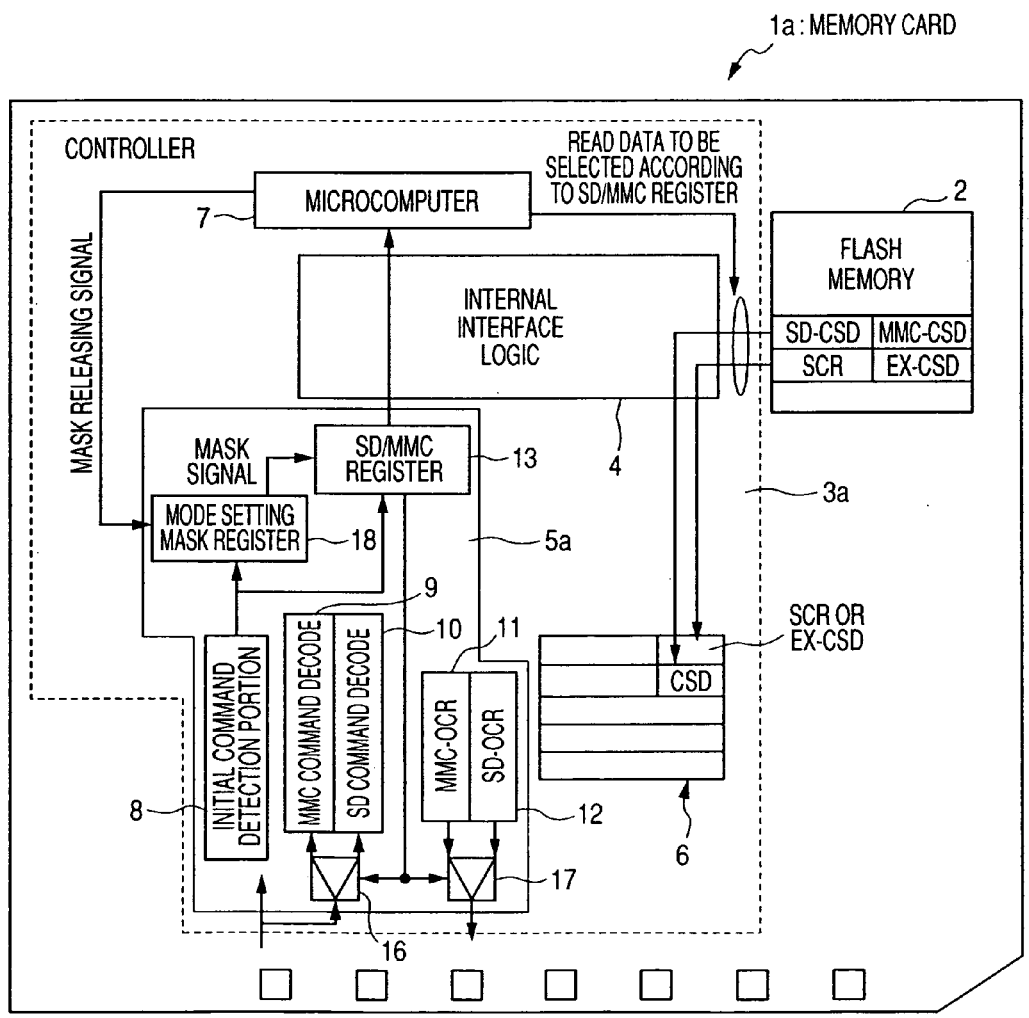
FIG. 5 is a block diagram of a memory card in a second embodiment of the present invention.

As illustrated in FIG. 5, a memory card 1a in the second embodiment comprises a flash memory 2 and a controller 3 as in the first embodiment. The controller 3 comprises an internal interface logic 4, a host interface (host interface portion) 5a, data buffers 6, and a microcomputer 7.

The host interface 5a is comprised of an initial command detection portion 8, an MMC command decode 9, an SD command decode 10, an MMC-OCR 11, an SD-OCR 12, and an SD/MMC register 13 as in the first embodiment. In addition, the host interface is provided with a mode setting mask register (mode setting mask portion) 18.

The mode setting mask register 18 is connected with the initial command detection portion 8 and the SD/MMC register 13. This mode setting mask register 18 outputs a mask signal to the SD/MMC register 13 based on the result of detection by the initial command detection portion 8.

Description will be given to power-on reset processing in a memory card 1a in the second embodiment with reference to the timing chart in FIG. 6 and the flowchart in FIG. 7. Here, it will be assumed that 'CMD55+CMD41' for SD mode is inputted as an initial command to the memory card 1a. If 'CMD1' for MultiMedia Card mode is inputted as an initial command to the memory card 1a, the same operation is performed.

Figure 6:
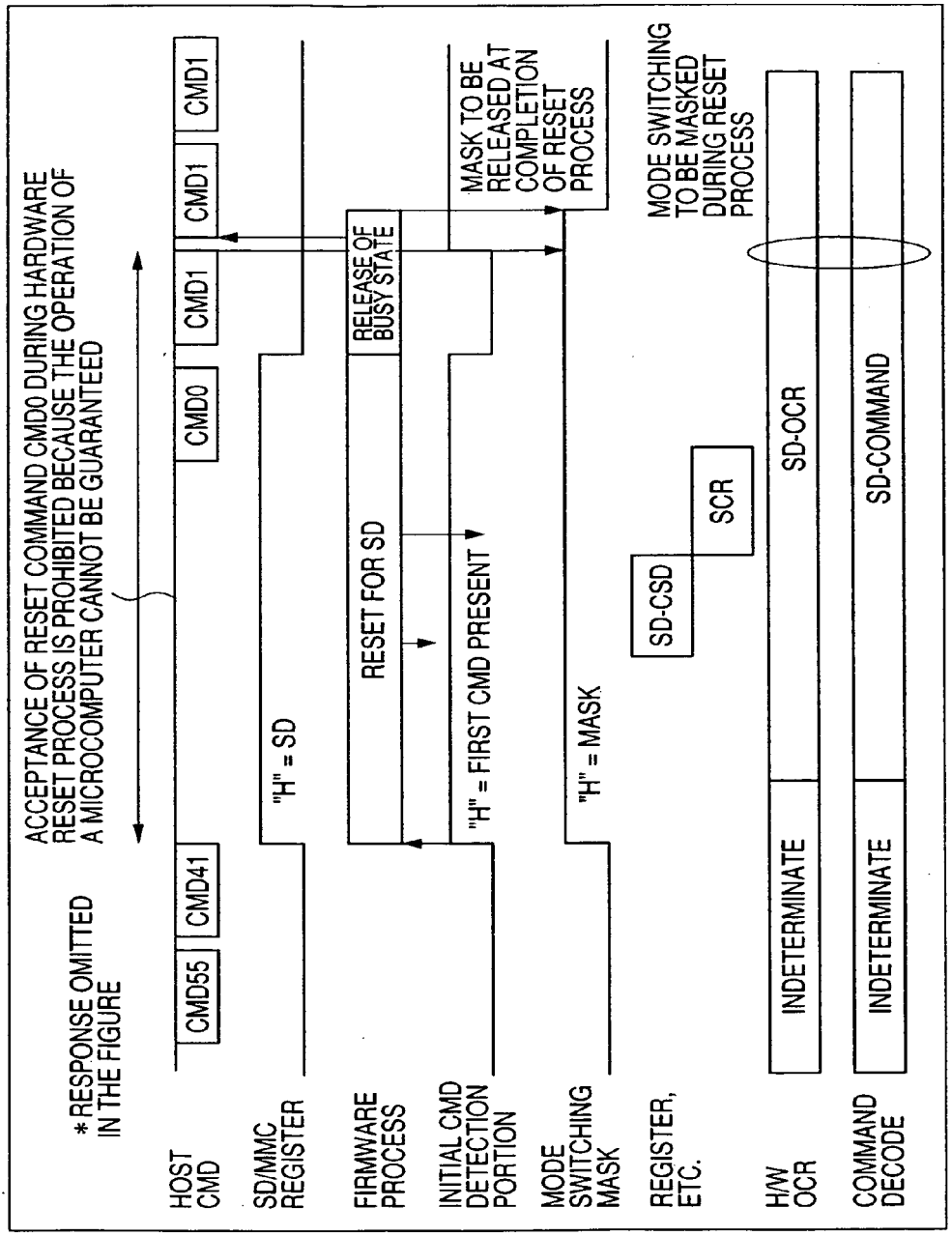
FIG. 6 is a chart illustrating signal timing in power-on reset processing in the memory card in FIG. 5.

FIG. 6 illustrates the signal timing with respect to commands outputted from a host, the SD/MMC register 13, the firmware process of the microcomputer 7, the initial command detection portion 8, the mode switching mask of the mode setting mask register 18, the MMC-OCR 11/the SD-OCR 12, and the MMC command decode 9/the SD command decode 10 from top down.

Figure 7:
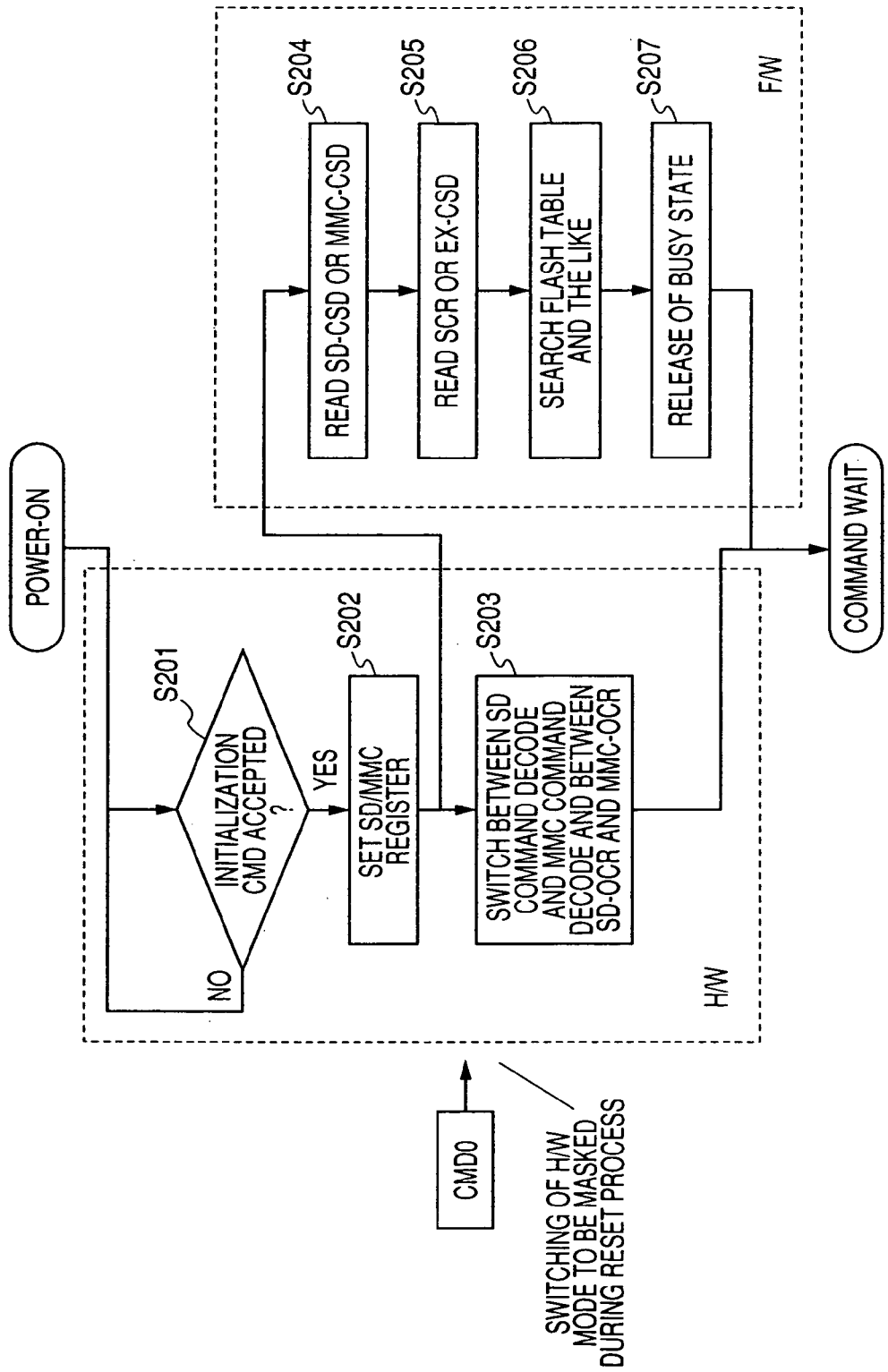
FIG. 7 is a flowchart illustrating power-on reset processing in the memory card in FIG. 5.

In FIG. 7, the flowchart encircled with a broken line, shown on the left, illustrates the initialization process for hardware, and the flowchart encircled with a broken line, shown on the right, illustrates the initialization process for firmware.

When the memory card 1a is inserted into a memory slot or the like provided in a host and a supply voltage VCC is supplied to the memory card 1a, initial command 'CMD55+CMD41' is outputted from the host. The initial command is for checking the voltage range within which the memory card 1a can operate and checking whether the internal processing of the memory card 1 has been completed (Step S201).

When the initial command detection portion 8 detects the initial command 'CMD55+CMD41' for SD mode, it operates as follows: it outputs the result of detection to the SD/MMC register 13 and sets it in the SD/MMC register 13 (High level) (Step S202), and further outputs it to the mode setting mask register 18.

On receipt of the result of detection from the initial command detection portion 8, the mode setting mask register 18 outputs a mask signal of High level to the SD/MMC register 13. Any initial command 'CMD1' inputted while this mask signal is being outputted is processed as a polling command.

While the mask signal from the mode setting mask register 18 is at High level, the following procedure is taken with respect to the SD/MMC register 13: even if initial command 'CMD1' for MultiMedia Card mode is inputted during reset process, switching from SD mode to MultiMedia Card mode is masked.

The switch portions 16 and 17 change connection based on the data set in the SD/MMC register 13 (Step S203) to respectively select the SD command decode 10 and the SD-OCR 12. Thereafter, the memory card 1 enters command wait state.

In parallel with the process of Step S203, the microcomputer 7 accesses the flash memory 2 based on the result of detection set in the SD/MMC register 13. It reads SD-CSD stored in the system area (Step S204), and stores it in the data buffers 6.

Subsequently, the microcomputer 7 reads SCR from the flash memory 2 (Step S205), and stores it in the data buffers 6.

Thereafter, the microcomputer 7 searches a flash table and the like for managing an alternate area (Step S206), releases busy state, and outputs a mask releasing signal to the mode setting mask register 18 (Step S207). On receipt of the mask releasing signal, the mode setting mask register 18 releases the mask signal.

When busy state is released in the process of Step S206, the mask signal outputted from the mode setting mask register 18 is brought to Low level. As a result, the mask is released, and the memory card enters command wait state.

Thus, according to the second embodiment, mode switching is masked while a mask signal is being outputted. Therefore, initializing operation failure can be prevented without fail in a memory card 1a. As a result, the reliability of the memory card 1a can be significantly enhanced.

THIRD EMBODIMENT

Figure 8:
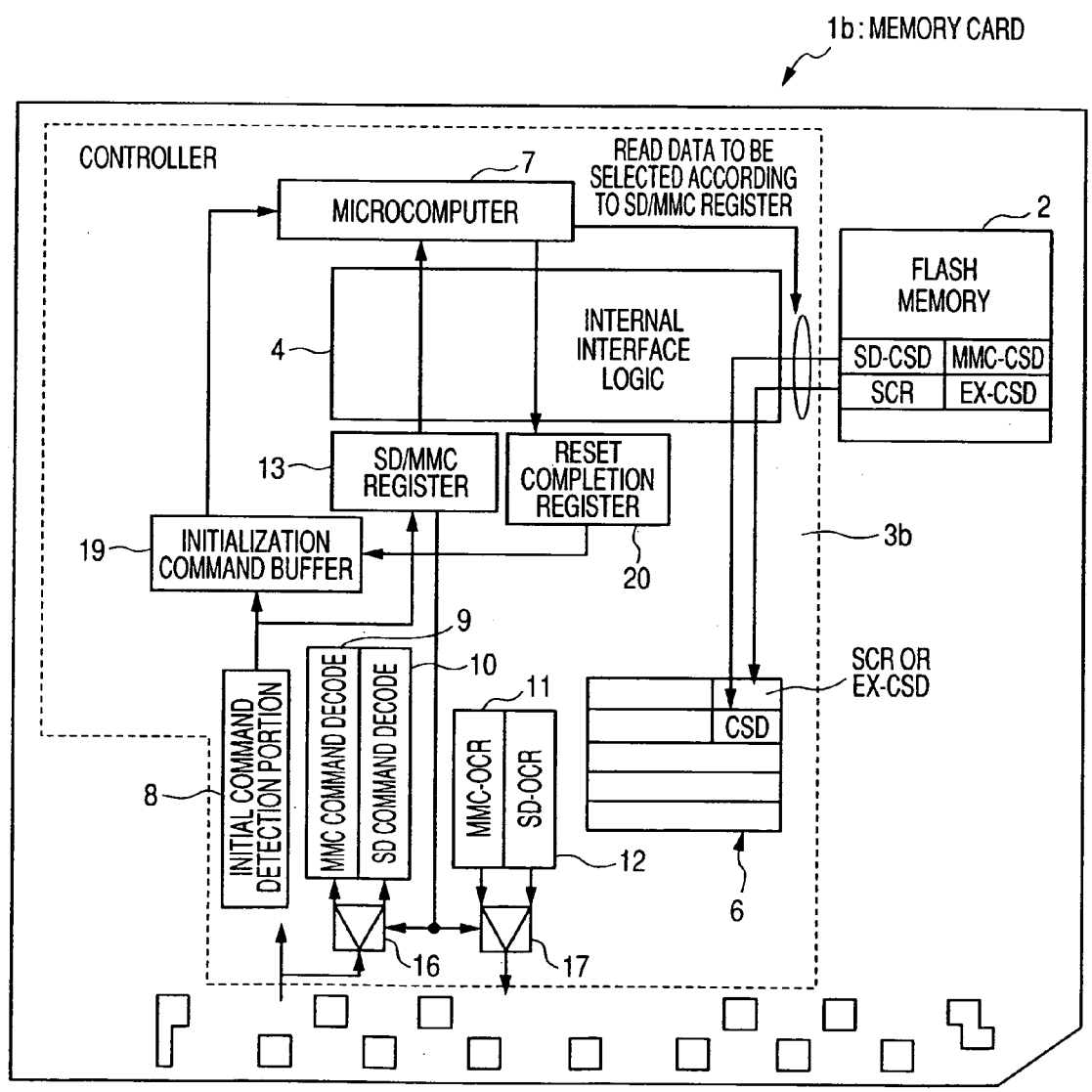
FIG. 8 is a block diagram of a memory card in a third embodiment of the present invention.

As illustrated in FIG. 8, a memory card 1b in the third embodiment comprises a flash memory 2 and a controller 3 as in the first embodiment. The controller 3 comprises an internal interface logic 4, a host interface (host interface portion) 5b, data buffers 6, and a microcomputer 7.

The host interface 5b is comprised of an initial command detection portion 8, an MMC command decode 9, an SD command decode 10, an MMC-OCR 11, an SD-OCR 12, and an SD/MMC register 13 as in the first and second embodiments. In addition, the host interface is provided with an initialization command buffer (initial command storage portion) 19 and a reset completion register (reset completion setting portion) 20.

The initialization command buffer 19 is connected with the microcomputer 7, initial command detection portion 8, and SD/MMC register 13. This initialization command buffer 19 buffers initial commands detected by the initial command detection portion 8.

The reset completion register 20 is connected with the microcomputer 7. When power-on reset processing is completed, a signal indicating the completion of reset process of the memory card 1b is set in the register by the microcomputer 7.

Description will be given to power-on reset processing in a memory card 1b in the third embodiment with reference to the timing chart in FIG. 9 and the flowchart in FIG. 10.

Here, description will be given to the following case: 'CMD55+CMD41' for SD mode is inputted as an initial command to the memory card 1b, and initial command 'CMD1' for MultiMedia Card mode is inputted during initialization according thereto. Also, in cases where initial command 'CMD1' for MultiMedia Card mode is inputted and 'CMD55+CMD41' for SD mode is inputted to the memory card 1b during initialization according thereto, the same operation is performed.

Figure 9:
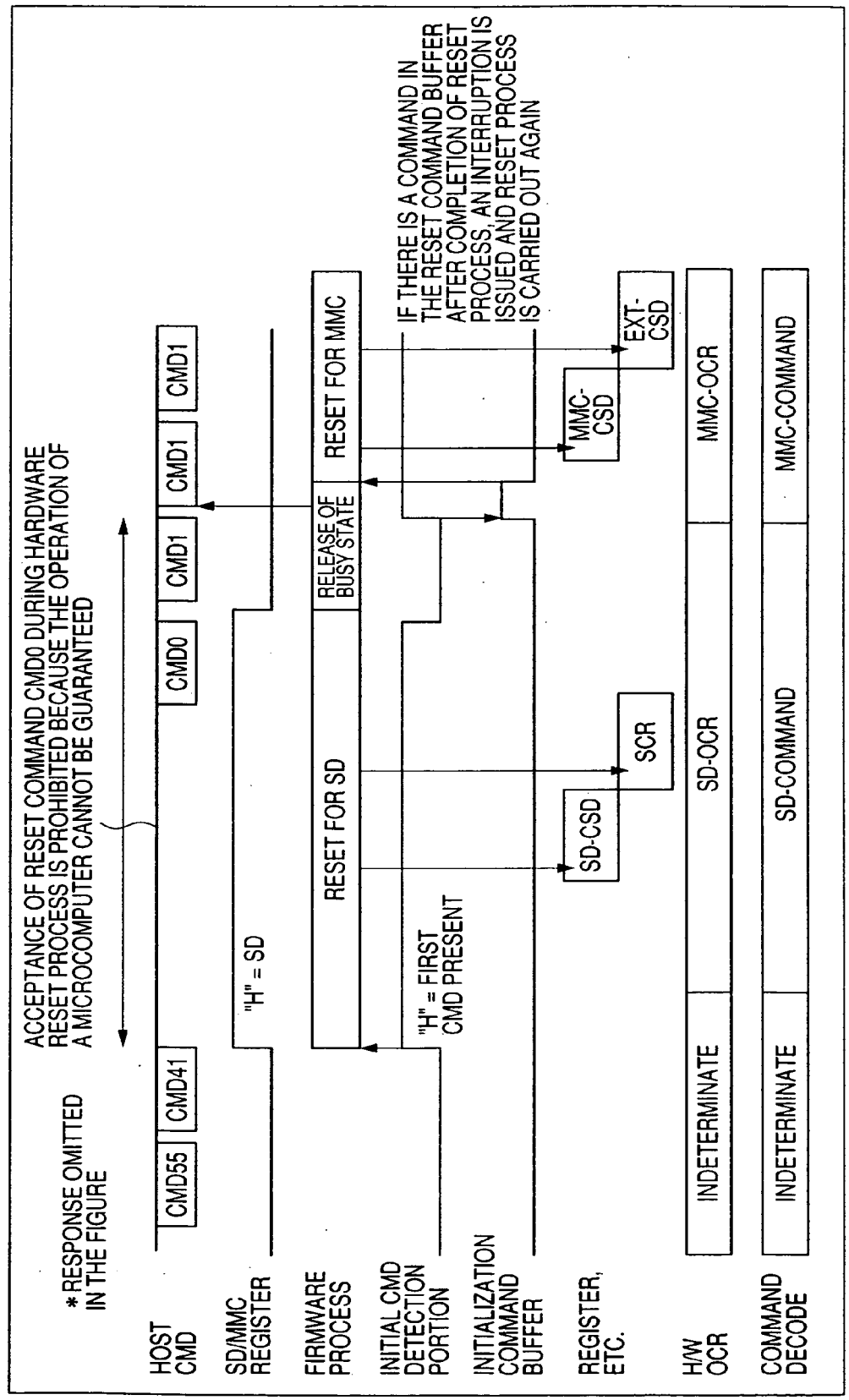
FIG. 9 is a chart illustrating signal timing in power-on reset processing in the memory card in FIG. 8.
Figure 12:
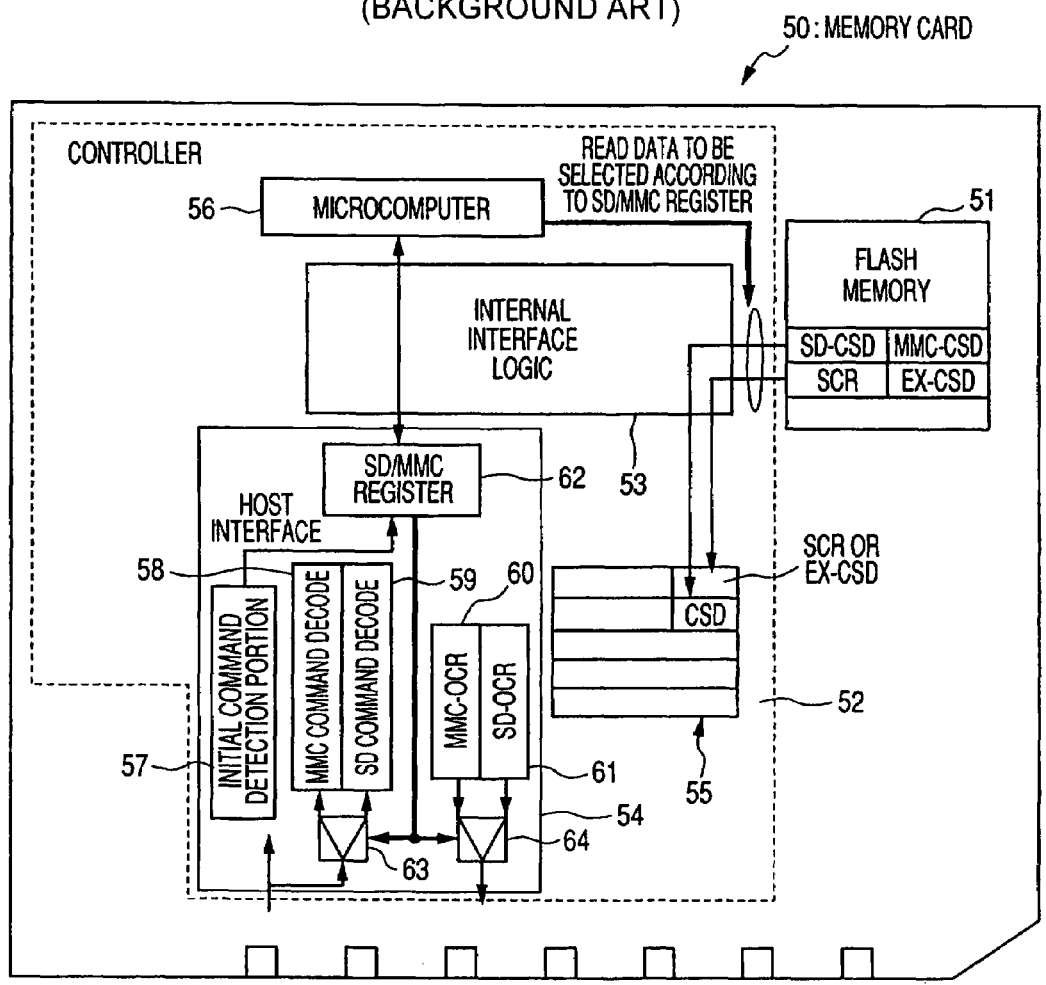
FIG. 12 is a block diagram of a memory card examined by the present inventors.
Figure 13:
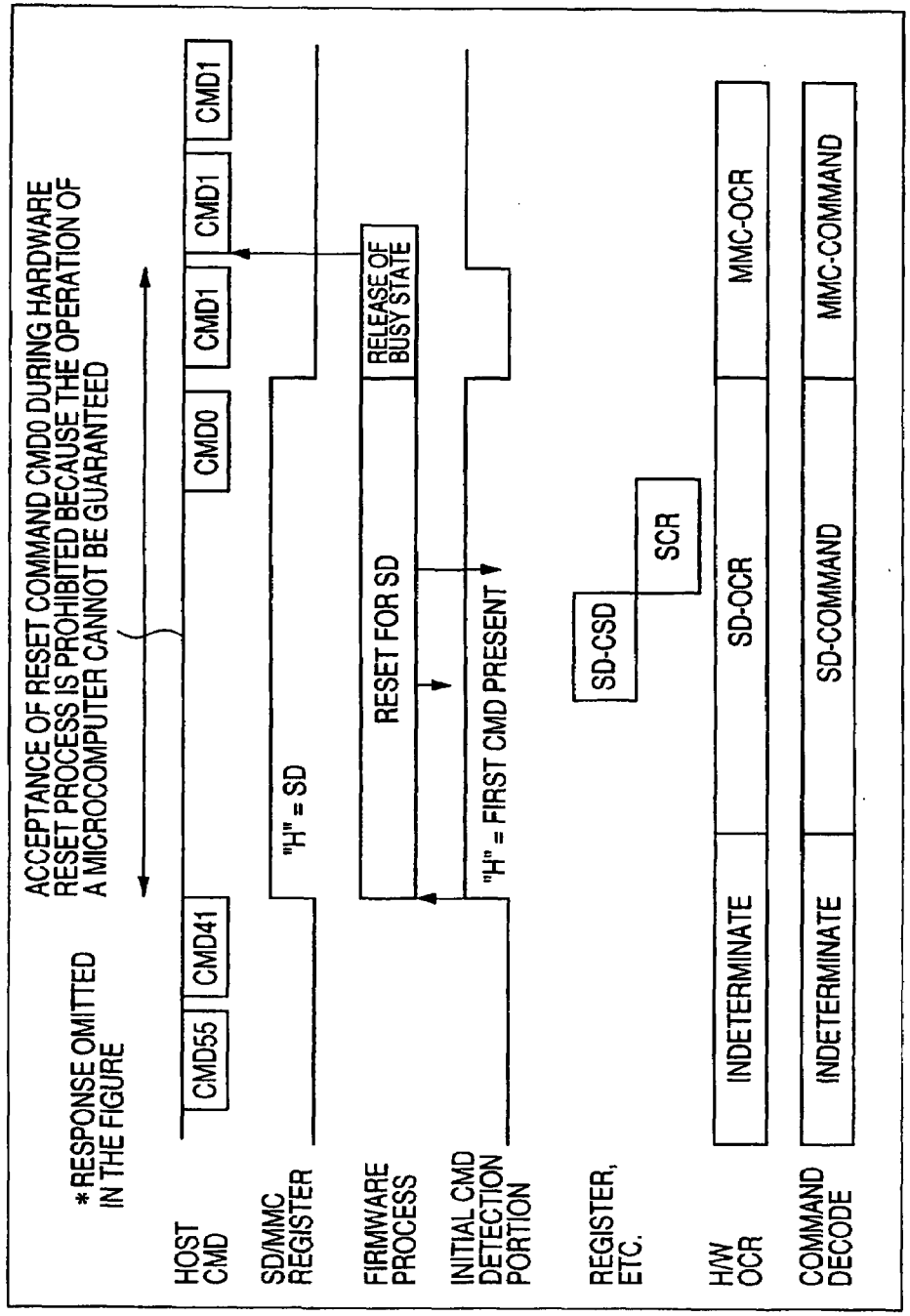
FIG. 13 is a chart illustrating signal timing in power-on reset processing in the memory card in FIG. 12.

FIG. 9 illustrates the signal timing with respect to commands outputted from a host, the SD/MMC register 13, the firmware process of the microcomputer 7, the initial command detection portion 8, the initialization command buffer 19, the MMC-OCR 11/the SD-OCR 12, and the MMC command decode 9/the SD command decode 10 from top down.

In FIG. 10, the flowchart encircled with a broken line, shown on the left, illustrates the initialization process for hardware, and the flowchart encircled with a broken line, shown on the right, illustrates the initialization process for firmware.

When the memory card 1b is inserted into a memory slot or the like provided in a host and a supply voltage VCC is supplied to the memory card 1b, initial command 'CMD55+CMD41' is outputted from the host. The initial command is for checking the voltage range within which the memory card 1b can operate and checking whether the internal processing of the memory card 1 has been completed (Step S301).

When the initial command detection portion 8 detects the initial command 'CMD55+CMD41' for SD mode, it operates as follows: it outputs the result of detection to the SD/MMC register 13 and sets it in the SD/MMC register 13 (High level) (Step S302).

The switch portions 16 and 17 change connection based on the data set in the SD/MMC register 13 (Step S303) to respectively select the SD command decode 10 and the SD-OCR 12. Thereafter, the memory card 1 enters command wait state.

In parallel with the process of Step S303, the microcomputer 7 accesses the flash memory 2 based on the result of detection set in the SD/MMC register 13. It reads SD-CSD stored in the system area (Step S304), and stores it in the data buffers 6.

Subsequently, the microcomputer 7 reads SCR from the flash memory 2 (Step S305), and stores it in the data buffers 6. Thereafter, the microcomputer 7 searches a flash table and the like for managing an alternate area (Step S306) and releases busy state (Step S307). Further, a signal indicating the completion of power-on reset processing is set in the reset completion register 20 by the microcomputer 7.

If, for example, initial command 'CMD1' for MultiMedia Card mode is inputted from the host before busy state is released by the processing of Step S307 the following operation is performed: the initial command detection portion 8 detects that 'CMD1' has been inputted, and outputs the result of detection.

The initialization command buffer 19 buffers the result of detection by the initial command detection portion 8 (Step S309). If a signal is set in the reset completion register 20 after busy state is released, the initialization command buffer 19 outputs a signal indicating the input of 'CMD1' (High level) to the microcomputer 7. As a result, the processes of Steps S304 to S306 are carried out, and the firmware is initialized in MultiMedia Card mode.

Thus, according to the third embodiment, the following operation is performed even if an initial command under the other mode is inputted while the memory card 1b is being initialized in either mode: initialization is successively carried out according to the initial commands for all the modes inputted to the memory card 1b. Therefore, initializing operation failure can be prevented without fail in a memory card 1b. As a result, the reliability of the memory card 1b can be significantly enhanced.

Up to this point, the invention made by the present inventor has been concretely described based on embodiments thereof. However, the present invention is not limited to the above-mentioned embodiments, and various modifications can be made without departing from the spirit of the invention, needless to add.

INDUSTRIAL APPLICABILITY

As mentioned above, a memory card according to the present invention and an initialization setting method thereof are suitable for techniques to avoid malfunction in a memory card that operates in accordance both with the SD Card standard and with the MultiMedia Card standard.

What is claimed is:

1. A memory card comprising:
a nonvolatile semiconductor memory having a plurality of nonvolatile memory cells and capable of storing predetermined information; and
a controller that instructs the operation of the nonvolatile semiconductor memory based on a command issued from the outside,
wherein the controller comprises a host interface portion that detects an initialization setting command for first or second operation mode issued from the outside, and, if, after completion of initialization setting according to the initialization setting command, the operation mode of the detected initialization setting command and the operation mode in which firmware reset process was carried out do not agree with each other, outputs a disagreement detection signal, and
wherein, when the controller receives a disagreement occurrence detection signal from a comparison circuit after execution of initialization setting, the controller carries out initialization process again based on a result of detection stored in an initialization command storage portion.

2. The memory card according to claim 1,
wherein the host interface portion comprises:
an initial command detection portion that detects an initialization setting command for first or second operation mode, issued from the outside;
an initialization command storage portion that stores the result of detection by the initial command detection portion;
a firmware reset process storage portion that stores data indicating in which operation mode, first operation mode or second operation mode, firmware reset process was carried out; and
a comparison circuit that compares the result of detection stored in the initialization command storage portion with data stored in the firmware reset process storage portion, and, if the result of detection and the data do not agree with each other, outputs a disagreement occurrence detection signal, wherein the controller carries out initialization setting in either first or second operation mode based on the result of detection stored in the initialization command storage portion, and wherein, when the controller receives a disagreement occurrence detection signal from the comparison circuit after execution of initialization setting, the controller carries out initialization process again based on the result of detection stored in the initialization command storage portion.

3. The memory card according to claim 1, wherein the controller comprises:

a first command decode portion that decodes commands for the first operation mode;

a second command decode portion that decodes commands for the second operation mode;

a first switching portion that changes the connection of the first or second command decode portion based on the result of detection stored in the initialization command storage portion;

a first OCR that defines a voltage range within which operation in the first operation mode is possible;

a second OCR that defines a voltage range within which operation in the second operation mode is possible; and a second switching portion that changes the connection of the first or second OCR based on the result of detection stored in the initialization command storage portion.

4. The memory card according to claim 2, wherein the controller comprises:

a first command decode portion that decodes commands for the first operation mode;

a second command decode portion that decodes commands for the second operation mode;

a first switching portion that changes the connection of the first or second command decode portion based on the result of detection stored in the initialization command storage portion;

a first OCR that defines a voltage range within which operation in the first operation mode is possible;

a second OCR that defines a voltage range within which operation in the second operation mode is possible; and a second switching portion that changes the connection of the first or second OCR based on the result of detection stored in the initialization command storage portion.

5. A memory card comprising:

a nonvolatile semiconductor memory having a plurality of nonvolatile memory cells and capable of storing predetermined information; and a controller that instructs the operation of the nonvolatile semiconductor memory based on a command issued from the outside, wherein the controller comprises a host interface portion that, when an initialization setting command for first or second operation mode issued from the outside is detected, outputs a mask signal, and does not accept a new initialization setting command while initialization setting is being carried out in either first or second operation mode.

6. The memory card according to claim 5, wherein the host interface portion comprises:

an initialization command storage portion that stores the result of detection detected by the initial command detection portion; and a mode setting mask portion that, when the initial command detection portion detects an initialization setting command for first or second operation mode, outputs a mask signal to the initialization command storage portion to mask the operation of the initialization command storage portion, and wherein the controller carries out initialization setting in either first or second operation mode based on the result of detection stored in the initialization command storage portion, and, after completion of the initial setting, outputs a mask releasing signal to the mode setting mask portion to release the mask signal of the mode setting mask portion.

7. The memory card according to claim 5, wherein the controller comprises:

a first command decode portion that decodes commands for the first operation mode;

a second command decode portion that decodes commands for the second operation mode;

a first switching portion that changes the connection of the first or second command decode portion based on the result of detection stored in the initialization command storage portion;

a first OCR that defines a voltage range within which operation in the first operation mode is possible;

a second OCR that defines a voltage range within which operation in the second operation mode is possible; and a second switching portion that changes the connection of the first or second OCR based on the result of detection stored in the initialization command storage portion.

8. The memory card according to claim 6, wherein the controller comprises:

a first command decode portion that decodes commands for the first operation mode;

a second command decode portion that decodes commands for the second operation mode;

a first switching portion that changes the connection of the first or second command decode portion based on the result of detection stored in the initialization command storage portion;

a first OCR that defines a voltage range within which operation in the first operation mode is possible;

a second OCR that defines a voltage range within which operation in the second operation mode is possible; and a second switching portion that changes the connection of the first or second OCR based on the result of detection stored in the initialization command storage portion.

9. A memory card comprising:

a nonvolatile semiconductor memory having a plurality of nonvolatile memory cells and capable of storing predetermined information; and a controller that instructs the operation of the nonvolatile semiconductor memory based on a command issued from the outside, wherein the controller comprises a host interface portion that detects an initialization setting command for first or second operation mode issued from the outside, successively stores the results of detection, and successively outputs the stored results of detection each time an initialization setting completion signal is received, and wherein the controller carries out initialization setting in either first or second operation mode based on the result of detection, and, if a new result of detection is stored after completion of the initialization setting, carries out firmware reset process based on the result.

10. The memory card according to claim 9, wherein the host interface portion comprises:

an initial command detection portion that detects an initialization setting command for first or second operation mode issued from the outside;

an initialization command storage portion that stores the result of detection by the initial command detection portion;
an initialization command storage portion that successively stores the results of detection by the initial command detection portion, and successively outputs the stored results of detection each time an initialization setting completion signal is received; and
a reset completion setting portion that outputs an initialization setting completion signal when initialization setting is completed, and
wherein the controller carries out initialization setting in either first or second operation mode based on the result of detection stored in the initialization command storage portion, and, after completion of the initialization setting, carries out firmware reset process based on the results of detection successively outputted from the initialization command storage portion each time the initialization setting completion signal is received.

11. The memory card according to claim 9,
wherein the controller comprises:
a first command decode portion that decodes commands for the first operation mode;
a second command decode portion that decodes commands for the second operation mode;
a first switching portion that changes the connection of the first or second command decode portion based on the result of detection stored in the initialization command storage portion;
a first OCR that defines a voltage range within which operation in the first operation mode is possible;
a second OCR that defines a voltage range within which operation in the second operation mode is possible; and
a second switching portion that changes the connection of the first or second OCR based on the result of detection stored in the initialization command storage portion.

12. The memory card according to claim 10,
wherein the controller comprises:
a first command decode portion that decodes commands for the first operation mode;
a second command decode portion that decodes commands for the second operation mode;
a first switching portion that changes the connection of the first or second command decode portion based on the result of detection stored in the initialization command storage portion;
a first OCR that defines a voltage range within which operation in the first operation mode is possible;
a second OCR that defines a voltage range within which operation in the second operation mode is possible; and
a second switching portion that changes the connection of the first or second OCR based on the result of detection stored in the initialization command storage portion.

13. An initialization setting method of a memory card in which a command and an operating voltage are supplied from the outside, and a controlling means accesses a nonvolatile semiconductor memory according to the command to store information or read information, the initialization setting method comprising the steps of:
detecting an initialization setting command for first or second operation mode issued from the outside, by an initial command detection portion;
storing the result of detection by the initial command detection portion in an initialization command storage portion;
carrying out initialization setting in either first or second operation mode by the controller based on the result of detection stored in the initialization command storage portion;
storing, in a firmware reset process storage portion, data indicating in which operation mode firmware reset process was carried out in initialization setting in the first or second operation mode;
comparing the result of detection stored in the initialization command storage portion with data stored in the firmware reset process storage portion by a comparison circuit, and, if the result of detection and the data do not agree with each other, outputting a disagreement occurrence detection signal; and
carrying out initialization process again by the controller based on the result of detection stored in the initialization command storage portion when the disagreement occurrence detection signal is received.

14. An initialization setting method of a memory card in which a command and an operating voltage are supplied from the outside, and a controlling means accesses a nonvolatile semiconductor memory according to the command to store information or read information, the initialization setting method comprising the steps of:
detecting an initialization setting command for first or second operation mode issued from the outside, by an initial command detection portion;
storing the result of detection by the initial command detection portion in an initialization command storage portion;
outputting a mask signal to the initialization command storage portion by a mode setting mask portion when the initial command detection portion detects an initialization setting command for first or second operation mode, and thereby masking any result of detection newly inputted to the initialization command storage portion; and
carrying out initialization setting in either first or second operation mode by the controller based on the result of detection stored in the initialization command storage portion.

15. An initialization setting method of a memory card in which a command and an operating voltage are supplied from the outside, and a controlling means accesses a nonvolatile semiconductor memory according to the command to store information or read information, the initialization setting method comprising the steps of:
detecting an initialization setting command for first or second operation mode, issued from the outside, by an initial command detection portion;
storing the first result of detection by the initial command detection portion in an initialization command storage portion;
successively storing the results of detection by the initial command detection portion in the initialization command storage portion;
carrying out initialization setting in either first or second operation mode based on the result of detection stored in the initialization command storage portion, and, after completion of the initialization setting, outputting an initialization setting completion signal from a reset completion setting portion; and
carrying out firmware reset process based on the results of detection successively outputted from the initialization command storage portion each time the initialization setting completion signal is received after completion of the initialization setting.

* * * * *